(12) United States Patent
Tachibana et al.

(10) Patent No.: US 9,194,043 B2
(45) Date of Patent: Nov. 24, 2015

(54) ATOMIC LAYER DEPOSITION APPARATUS

(75) Inventors: Hiroyuki Tachibana, Tamano (JP); Kazutoshi Murata, Tamano (JP); Naomasa Miyatake, Tamano (JP); Yasunari Mori, Tamano (JP)

(73) Assignee: MITSUI ENGINEERING & SHIPBUILDING, Tokyo (JP)

( * ) Notice: Subject to any disclaimer, the term of this patent is extended or adjusted under 35 U.S.C. 154(b) by 829 days.

(21) Appl. No.: 13/203,381

(22) PCT Filed: Feb. 15, 2010

(86) PCT No.: PCT/JP2010/000911
§ 371 (c)(1),
(2), (4) Date: Aug. 25, 2011

(87) PCT Pub. No.: WO2010/103732
PCT Pub. Date: Sep. 16, 2010

(65) Prior Publication Data
US 2011/0303147 A1    Dec. 15, 2011

(30) Foreign Application Priority Data
Mar. 10, 2009   (JP) ................................ 2009-056620

(51) Int. Cl.
*C23C 16/44* (2006.01)
*C23C 16/46* (2006.01)
*C23C 16/455* (2006.01)
(Continued)

(52) U.S. Cl.
CPC ......... *C23C 16/4409* (2013.01); *C23C 16/4407* (2013.01); *C23C 16/45544* (2013.01); *C23C 16/46* (2013.01); *C23C 16/54* (2013.01); *C23C 16/4583* (2013.01)

(58) Field of Classification Search
CPC   C23C 16/4409; C23C 16/4407; C23C 16/46; C23C 16/45544; C23C 16/54; C23C 16/4583
See application file for complete search history.

(56) References Cited

U.S. PATENT DOCUMENTS 4,018,184 A * 4/1977 Nagasawa et al. ............ 118/715
4,989,540 A * 2/1991 Fuse et al. ..................... 118/719
(Continued)

FOREIGN PATENT DOCUMENTS

JP     01-289254    * 11/1989
JP     1-289254 A     11/1989
(Continued)

OTHER PUBLICATIONS

Korean Office Action of corresponding Korean Patent Application No. 10-2011-7023446, dated on Jan. 10, 2013.

*Primary Examiner* — Jeffrie R Lund
(74) *Attorney, Agent, or Firm* — Global IP Counselors, LLP

(57) ABSTRACT

An atomic layer deposition apparatus for forming a thin film on a substrate, including a first container that defines a first inner space, a second container provided inside the first container to define a second inner space, the second container being canister-shaped and including a first opening at one end thereof, a source gas that forms the thin film on the substrate flowing to the second inner space through the first opening, and a pressing member including a gas supply port for supplying the source gas to the second inner space through the first opening, the pressing member being configured to press the second container in a longitudinal direction of the second container so that the second inner space be separated from the first inner space.

4 Claims, 4 Drawing Sheets

(51) Int. Cl.
*C23C 16/54* (2006.01)
*C23C 16/458* (2006.01)

(56) References Cited

U.S. PATENT DOCUMENTS

| | | | |
|---|---|---|---|
| 5,096,536 A * | 3/1992 | Cathey, Jr. | 438/715 |
| 5,728,602 A * | 3/1998 | Bellows | C23C 16/402 |
| | | | 438/14 |
| 5,782,980 A * | 7/1998 | Allen et al. | 118/715 |
| 6,026,764 A * | 2/2000 | Hwang | 118/723 E |
| 6,332,927 B1 * | 12/2001 | Inokuchi et al. | 118/725 |
| 2001/0047761 A1 * | 12/2001 | Van Wijck et al. | 118/724 |
| 2006/0032826 A1 * | 2/2006 | Liu | 211/41.18 |
| 2007/0187386 A1 * | 8/2007 | Kim et al. | 219/385 |
| 2009/0095731 A1 * | 4/2009 | Asakura et al. | 219/438 |
| 2009/0209113 A1 * | 8/2009 | Murata et al. | 438/795 |
| 2011/0303147 A1 * | 12/2011 | Tachibana | C23C 16/4409 |
| | | | 118/715 |

FOREIGN PATENT DOCUMENTS

| | | | |
|---|---|---|---|
| JP | 08-162415 | * | 6/1996 |
| JP | 8-162415 A | | 6/1996 |
| JP | 2001-168030 A | | 6/2001 |
| JP | 2006-176838 A | | 7/2006 |
| JP | 2006-310813 A | | 11/2006 |
| JP | 2007-134433 A | | 5/2007 |
| JP | 2007-239103 A | | 9/2007 |

* cited by examiner

ATOMIC LAYER DEPOSITION APPARATUS

TECHNICAL FIELD

The present invention relates to an atomic layer deposition (hereinafter, the Atomic Layer Deposition is also abbreviated to ALD) apparatus that forms a thin film on a substrate.

BACKGROUND ART

In an ALD method that is of one of thin-film forming techniques, two kinds of gases composed mostly of elements constituting a film to be formed are alternately supplied onto a deposition target substrate, and a thin film is repeatedly formed plural times in units of atomic layers on the substrate, thereby forming the film having a desired thickness. For example, a source gas containing Si and an oxidation gas containing O are used when a $SiO_2$ film is formed on the substrate. A nitridation gas is used instead of the oxidation gas when a nitride film is formed on the substrate.

So-called growth self-stopping action (self-limiting function) is utilized in the ALD method. That is, only a source gas component for one or several layers is adsorbed to a substrate surface while the source gas is supplied, but the excess source gas does not contribute to the growth.

When compared with a general CVD (Chemical Vapor Deposition) method, advantageously the ALD method has both high step coverage and film-thickness controllability. Therefore, the ALD method is expected to be practically applied to the formation of a capacitor for a memory element or an insulating film called "high-k gate." Additionally, the insulating film can be formed at a temperature of 300° C. to 400° C. in the ALD method. Then the ALD method is also expected to be applied to the formation of a gate insulating film for a thin-film transistor in a display device such as a liquid crystal display in which a glass substrate is used.

For example, in a deposition apparatus described in Patent Document 1, the source gas reacts in a reaction chamber of one reaction container to form the thin film on the substrate, and a volume of the reaction chamber of the reaction container is variable. A heater, on which the substrate is placed, moves up vertically to abut on a stopper, thereby reducing the volume of the reaction chamber.

PRIOR ART DOCUMENT

Patent Document

Patent Document 1: Japanese Patent Application Laid-Open No. 2006-310813

DISCLOSURE OF THE INVENTION

Problem to be Solved by the Invention

The deposition apparatus of Patent Document 1 can shorten a time necessary for one cycle of a deposition process using one reaction container and form the thin film having substantially even film quality. Currently, like eighth-generation and ninth-generation glass substrates whose sizes exceed 2 m by 2 m, with enlargement of the deposition target substrate, there is a strong need for forming the thin film having the evener film quality in the deposition apparatus.

An object of the invention is to provide an atomic layer deposition apparatus that can deposit the thin film having the film quality evener than ever before on the substrate.

Means for Solving the Problems

An atomic layer deposition apparatus according to a present invention forms a thin film on a substrate. The atomic layer deposition apparatus comprising: a first container that defines a first inner space; a second container provided inside the first container to define a second inner space, the second container being canister-shaped and including a first opening at one end thereof, a source gas that forms the thin film on the substrate flowing to the second inner space through the first opening; and a pressing member including a gas supply port for supplying the source gas to the second inner space through the first opening, the pressing member being configured to press the second container in a longitudinal direction of the second container so that the second inner space be separated from the first inner space.

Effect of the Invention

According to the atomic layer deposition apparatus of the invention, the thin film having the film quality evener than ever before can be deposited on the substrate.

EMBODIMENT FOR CARRYING OUT THE INVENTION

Hereinafter, an atomic layer deposition apparatus according to an embodiment of the invention will be described in detail.

(Schematic Configuration of Atomic Layer Deposition Apparatus)

In an atomic layer deposition apparatus 10, a source gas such as TMA (Tri-Methyl-Aluminium) and an oxidation gas such as ozone $O_3$ are alternately supplied to perform deposition in units of atoms, thereby forming a thin film.

Figure 1:
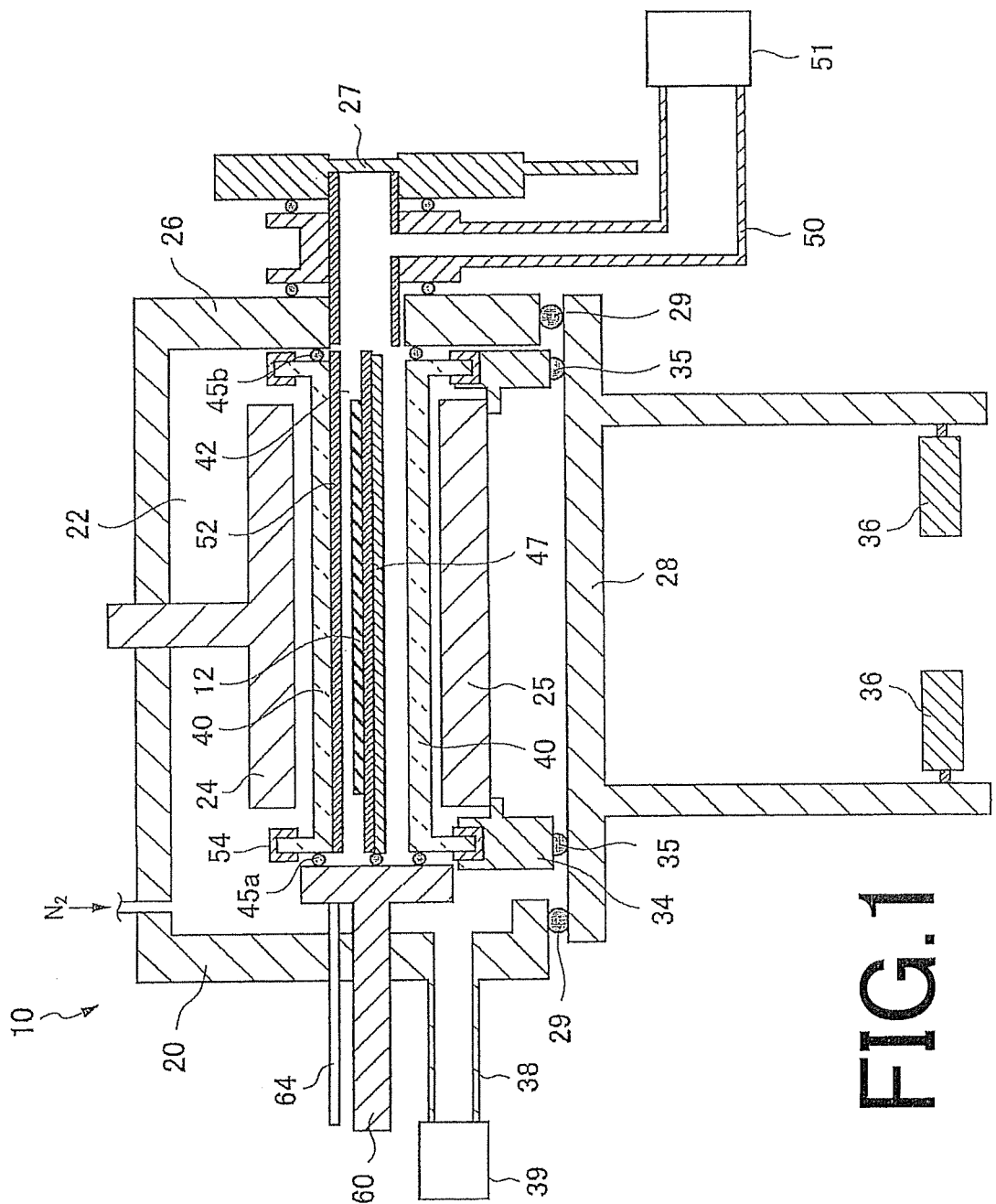
FIG. 1 is a sectional view illustrating a schematic configuration of an atomic layer deposition apparatus according to an embodiment of the invention.

FIG. 1 is a sectional view illustrating a schematic configuration of the atomic layer deposition apparatus (hereinafter referred to as an ALD apparatus) 10 that forms the thin film on a substrate 12.

The ALD apparatus 10 mainly includes a first container 20, a second container 40, and a pressing member 60. The first container 20 is an outside container that forms a first inner space 22 to maintain a predetermined pressure. The second container 40 is an inside container provided in the first container 20, and the second container 40 forms a second inner space 42 to maintain a predetermined pressure. The pressing member 60 horizontally presses the second container 40 to separate the second inner space 42 from the first inner space 22. The pressing member 60 includes a gas supply port 62 (see FIG. 3) through which the source gas supplied to the second inner space 42 flows.

Configurations of the first container 20, the second container 40, and the pressing member 60 will be described in detail below.

(First Container)

First, the first container 20 will be described with reference to FIG. 1.

The first container 20 is made of a metallic material such as SUS. A gas introduction port through which a $N_2$ gas (or inert gas) is introduced to the first inner space 22 is provided in an upper wall of the first container 20. An exhaust port to which an exhaust pipe 38 is connected is provided in a sidewall of the first container 20. The gas in the first inner space 22 is exhausted to the outside of the first container 20 through the exhaust port by an exhaust unit 39 such as a turbo molecular pump. Therefore, the first inner space 22 is maintained at a predetermined pressure in an atmosphere of the introduced $N_2$ gas. Oxidation of heaters 24 and 25 (described later) can be suppressed by reducing the first inner space 22 to the predetermined pressure. Through-holes through which a pressing member 60 and a gas introduction pipe 64 (described later) penetrate are made in the sidewall of the first container 20.

The second container 40 is provided inside the first container 20, and the heater 24 is provided parallel to and above the second container 40. The heater 24 heats the source gas supplied to the second inner space 42 and the substrate 12 placed in the second container 40 through the second container 40. A wiring and the like of the heater 24 are extracted to the outside through a through-hole made in an upper portion of the first container 20 and connected to a power supply (not illustrated).

The second container 40 is provided inside the first container 20, and the heater 25 is provided parallel to and below the second container 40. The heater 25 is supported by a support mechanism 34 (described later). The heater 25 heats the substrate 12 placed in the second container 40 through the second container 40. A wiring and the like of the heater 25 are extracted to the outside of the first container 20 through a through-hole (not illustrated) and connected to the power supply (not illustrated).

A through-hole is made in a sidewall portion 26 of the first container 20 to carry in and out the substrate 12. The through-hole is made to oppose a second opening 46 (see FIG. 2(a)) of the second container 40 (described later). A shutter 27 connected to the outside of the first container 20 is provided in a portion that is horizontally extended from the through-hole toward the outside of the second container 40. Accordingly, when the substrate 12 is carried in, the shutter 27 is opened to carry the substrate 12 in the second container 40 through the second opening 46. When the substrate 12 is carried out, the shutter 27 is opened to carry out the substrate 12 from the second container 40 through the second opening 46.

A support mechanism 34 that supports the second container 40 is provided on a bottom portion 28 of the first container 20. The support mechanism 34 includes a moving mechanism 35 such as a wheel (caster) so as to be able to move in an in-plane direction of the bottom portion 28 of the first container 20. The support mechanism 34 also supports the heater 25 while supporting the second container 40.

The bottom portion 28 of the first container 20 can be separated from the sidewall and the upper wall of the first container 20. Two rods extended downward in FIG. 1 are provided in the bottom portion 28 of the first container 20, and lifting mechanisms 36 such as hydraulic cylinders are provided in the rods, respectively. The lifting mechanisms 36 vertically lift and lower the bottom portion 28 of the first container 20, the support mechanism 34, and the second container 40 and the heater 25 that are supported by the support mechanism 34. An O-ring 29 is provided between the bottom portion 28 and the sidewall portion of the first container 20, whereby the lifting mechanism 36 lifts the bottom portion 28 to close the first inner space 22 from the outside.

(Second Container)

Figure 2A:
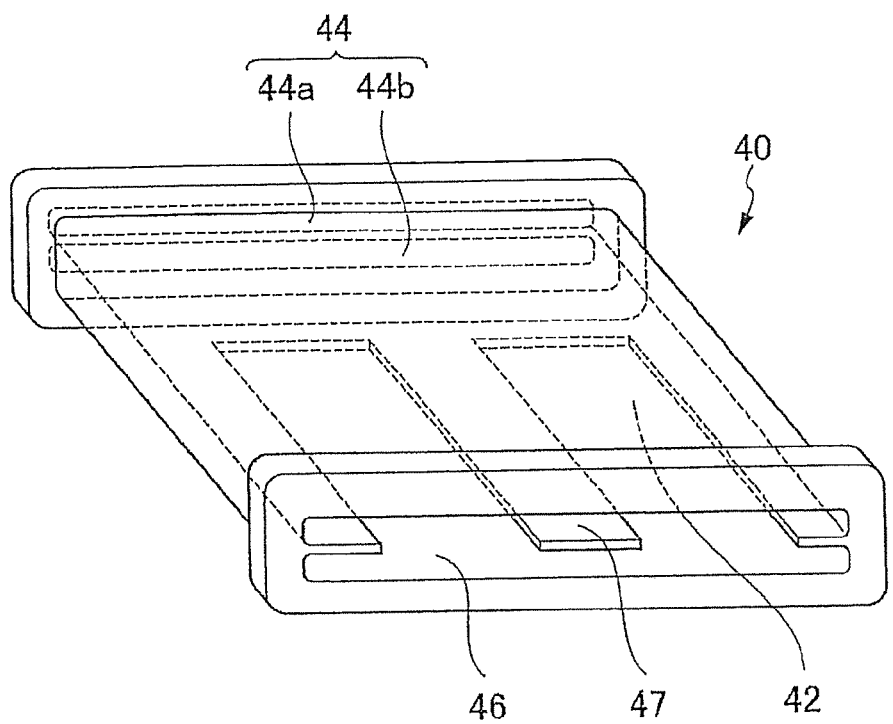
FIG. 2(a) is a schematic diagram illustrating a configuration of a second container of the atomic layer deposition apparatus of FIG. 1.

Then the second container 40 will be described with reference to FIG. 2. FIG. 2(a) is a schematic diagram illustrating the configuration of the second container 40.

The second container 40 is provided inside the first container 20. The second container 40 is a canister-shaped container that forms the second inner space 42. Preferably the second container 40 is made of quartz from the viewpoint of a stable material. When a glass substrate is used as the substrate 12, because the substrate 12 is substantially identical to the second container 40 in the material, advantageously there is no risk that a different component adheres to the substrate 12.

The second container 40 is supported by the support mechanism 34 so as to be horizontally located inside the first container 20. A first opening 44 is provided at one end of the canister shape, and the source gas that forms the thin film on the substrate 12 flows through the first opening 44. In the embodiment, two first openings 44a and 44b are provided as illustrated in FIG. 2(a). The first opening 44a is provided vertically higher than a position in which a substrate support portion 47 (described later) is provided.

The second opening 46 is provided at an opposite end to the side on which the first opening 44 is provided, and the gas in the second inner space 42 flows to the outside of the second inner space 42 through the second opening 46. The second opening 46 is provided opposite the through-hole made in the sidewall portion 26 of the first container 20.

Figure 2B:
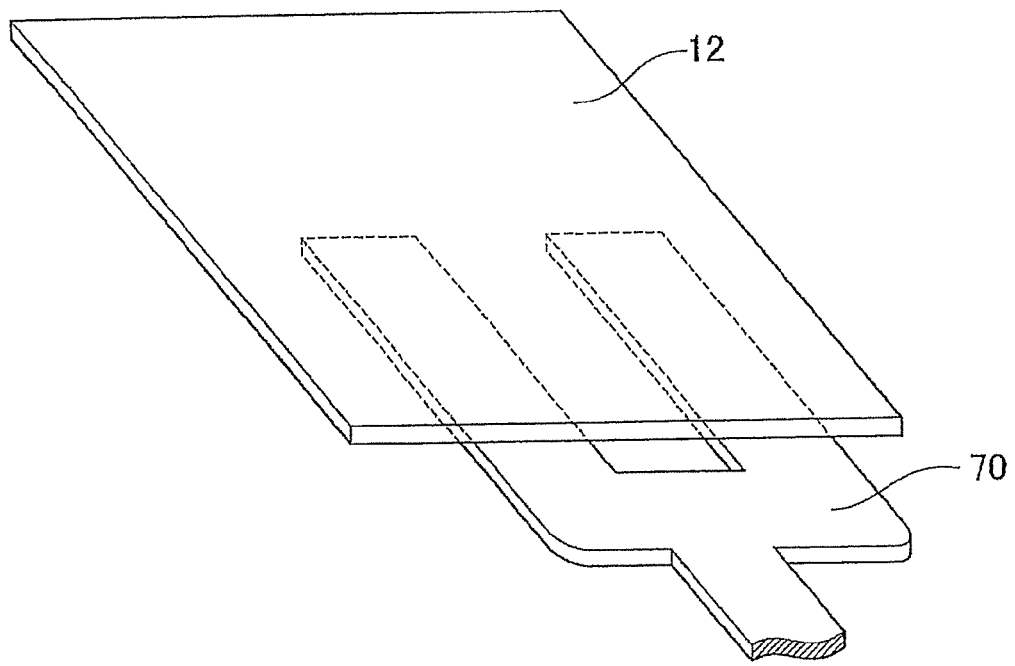
FIG. 2(b) is a view illustrating a method for carrying in and out a substrate.

FIG. 2(b) is a view illustrating a method for carrying in and out the substrate 12. The substrate 12 is placed on a fork portion 70 at a substrate placing leading end of a conveyance carriage. The substrate 12 placed on the fork portion 70 is carried in and out from the second container 40 through the shutter 27 and the second opening 46.

The substrate support portion 47 is provided inside the second container 40 to place the substrate 12 thereon. The side of the second opening 46 of the substrate support portion 47 is formed into a comb shape corresponding to the fork portion 70 at the substrate placing leading end of the conveyance carriage that carries in and out the substrate 12.

Thus the side of the second opening 46 is formed into the comb shape corresponding to the fork portion 70. Therefore, even if the large substrate 12 is carried in and out from the second inner space 42 having the low-profile canister shape, the substrate 12 can be carried in and out while the surface on which the thin film is formed does not come into contact with the inner surface of the second container 40.

The second container 40 is pressed in a longitudinal direction (horizontal direction of FIG. 1) of the canister shape by the pressing member 60. An O-ring 45a is provided between the pressing member 60 and the second container 40. An O-ring 45b is provided between the second container 40 and the sidewall portion 26 of the first container 20. The second container 40 is supported by the support mechanism 34 including the moving mechanism 35, so that the second container 40 can move in the longitudinal direction of the canister shape. Therefore, the pressing member 60 presses the second container 40 in the longitudinal direction of the canister shape, and the second container 40 is pressed against the first container 20 with the O-rings 45a and 45b interposed therebetween, thereby separating the second inner space 42 from the first inner space 22. That is, the pressing member 60 presses the second container 40 in the longitudinal direction of the canister-shaped second container 40, whereby the pressing member 60 separates the second inner space 42 from the first inner space 22.

Generally, when a space is sealed by the O-ring, the two spaces can more securely be separated from each other with shortening circumference of the O-ring. In the configuration illustrated in FIG. 1, because the second container 40 is pressed in the longitudinal direction of the canister-shaped second container 40, the circumference of the O-ring necessary to separate the second inner space 42 from the first inner space 22 can be shortened when compared to the configuration in which the second container is pressed in a crosswise direction (vertical direction) of the canister-shaped second container 40.

As described above, the second inner space 42 of the second container 40 can more securely be separated from the first inner space 22 by the configuration in which the second container 40 is pressed in the longitudinal direction of the canister-shaped second container 40. Therefore, a leak of the source gas from the second inner space 42 to the first inner space 22 can be suppressed.

Particles generated in the first inner space 22 due to the source gas leaking to the first inner space 22 can be reduced by suppressing the leak of the source gas from the second inner space 42 to the first inner space 22. Mixture of the particles, which exist in the first inner space 22, in the second inner space 42 can be suppressed by separating more securely the second inner space 42 from the first inner space 22. The film quality is degraded when the particles mixed in the second inner space 42 adheres to the substrate 12 placed in the second container 40. Accordingly, in the embodiment, as illustrated in FIG. 1, the thin film having the evener film quality can be deposited by the configuration in which the second container 40 is pressed in the longitudinal direction of the canister-shaped second container 40.

The source gas that forms the thin film on the substrate 12 flows through the first opening 44 to the second inner space 42 separated from the first inner space 22. The gas in the second inner space 42 flows to the outside of the second inner space 42 through the second opening 46 and the through-hole made in the sidewall portion 26 of the first container, which is provided opposite the second opening 46.

An exhaust port to which an exhaust pipe 50 is connected is provided on a pathway between the second opening 46 and the shutter 27, and the gas in the second inner space 42 is exhausted to the outside of the second container 40 by an exhaust unit 51 such as a turbo molecular pump. Therefore, the second inner space 42 is maintained at a predetermined pressure in an atmosphere of the introduced source gas. The pressure of the second inner space 42 may be equal to or different from that of the first inner space 22.

In order to prevent the thin film from adhering to other portions except the substrate on which the thin film should be formed, an anti-adhesion plate 52 is provided in the portions, such as the inside of the second container 40 and a gap between the second opening 46 and the shutter 27, through which the substrate 12 passes in carrying in and out the substrate 12.

A protective cap 54 is provided in the second container 40 to protect the container.

(Pressing Member)

Figure 3A:
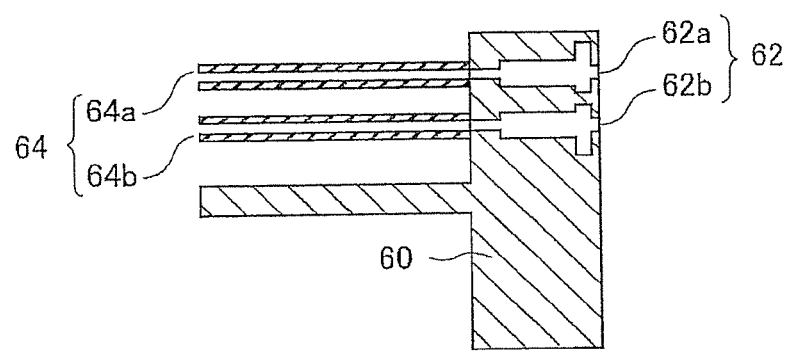
FIG. 3(a) is a sectional view illustrating a configuration of a pressing member in the atomic layer deposition apparatus of FIG. 1.
Figure 3B:
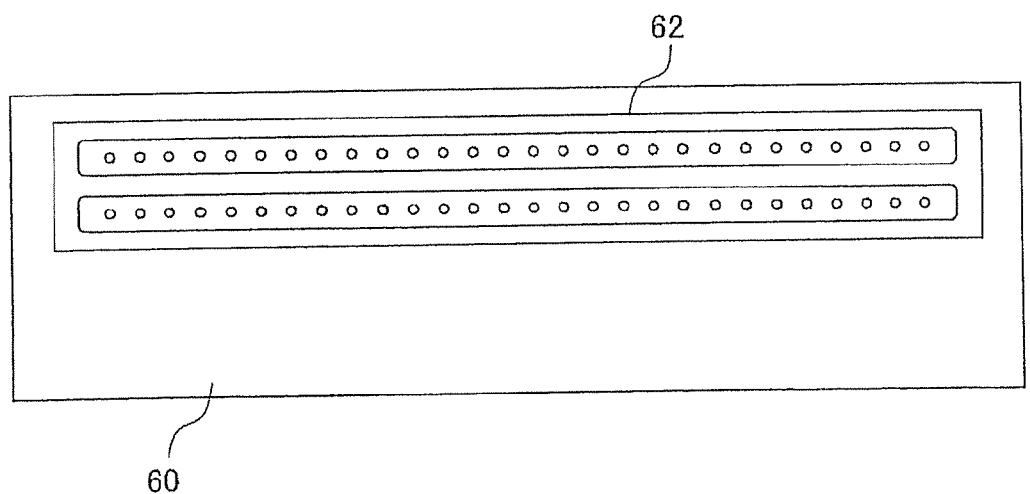
FIG. 3(b) is a right side view of the pressing member of FIG. 3(a).

Then the pressing member 60 will be described with reference to FIG. 3. FIG. 3(a) is a sectional view illustrating a configuration of an example of the pressing member 60. FIG. 3(b) is a right side view of the pressing member 60 of FIG. 3(a).

A gas supply port 62 is provided in the pressing member 60 to supply the source gas to the second inner space 42 through the first opening 44 of the second container 40. In the embodiment, as illustrated in FIG. 3(a), two gas supply ports 62a and 62b are provided in the pressing member 60. A gas introduction pipe 64 is connected to the pressing member 60 to introduce the source gas and the oxidation gas to the second inner space 42. In the embodiment, as illustrated in FIG. 3(a), two gas introduction pipes 64a and 64b are connected to the pressing member 60.

The source gas (for example, organic metal gas such as TMA) and a purge gas (for example, nitrogen gas) are introduced to the second inner space 42 through the gas introduction pipe 64a and the gas supply port 62a. The oxidation gas (for example, ozone) and the purge gas (for example, nitrogen gas) are introduced to the second inner space 42 through the gas introduction pipe 64b and the gas supply port 62b.

As illustrated in FIG. 3(b), a surface on the side on which the second container 40 of the pressing member 60 is pressed includes many gas supply ports 62. In order to evenly supply the source gas to the substrate 12, the gas supply ports 62 are provided at equal intervals in a width direction (horizontal direction of FIG. 3(b)) of the substrate 12. The gas supply ports 62 are provided in a range wider than that in the width direction of the substrate 12.

In the embodiment, as illustrated in FIG. 3, the gas supply ports 62a and 62b are provided so as to be located in height direction opposite the first opening 44a provided in the second container 40. Therefore, the source gas is supplied to the second inner space 42 immediately above the substrate support portion 47.

The source gas passes over the substrate 12 placed on the substrate support portion 47, and part of the source gas is adsorbed to the substrate 12. The activated oxidation gas can oxidize the source gas component adsorbed to the substrate 12.

In the embodiment, as illustrated in FIGS. 2 and 3, the source gas is not caused to flow to the whole of second inner space 42, but caused to flow immediately above the substrate support portion 47. Therefore, according to the embodiment, the source gas is caused to flow to the portion necessary for the growth of the thin film, so that use efficiency of the source gas can be enhanced.

In the second container 40, it is not always necessary to provide the first opening 44b of the second container 40. Therefore, only the first opening 44a may be provided without providing the first opening 44b.

The pressing member 60 of FIG. 1 can move in the longitudinal direction (horizontal direction) of the canister-shaped second container 40. The pressing member 60 moves in the longitudinal direction of the canister-shaped second container 40 to press the second container 40, which allows the second inner space 42 to be separated from the first inner space 22.

As used herein, separating the second inner space 42 from the first inner space 22 means that the pressure of the first inner space 22 and the pressure of the second inner space 42 are spatially separated to an extent to which the pressure of the first inner space 22 and the pressure of the second inner space 42 can individually be controlled.

(Schematic Configuration of Atomic Layer Deposition Apparatus During Cleaning)

Figure 4:
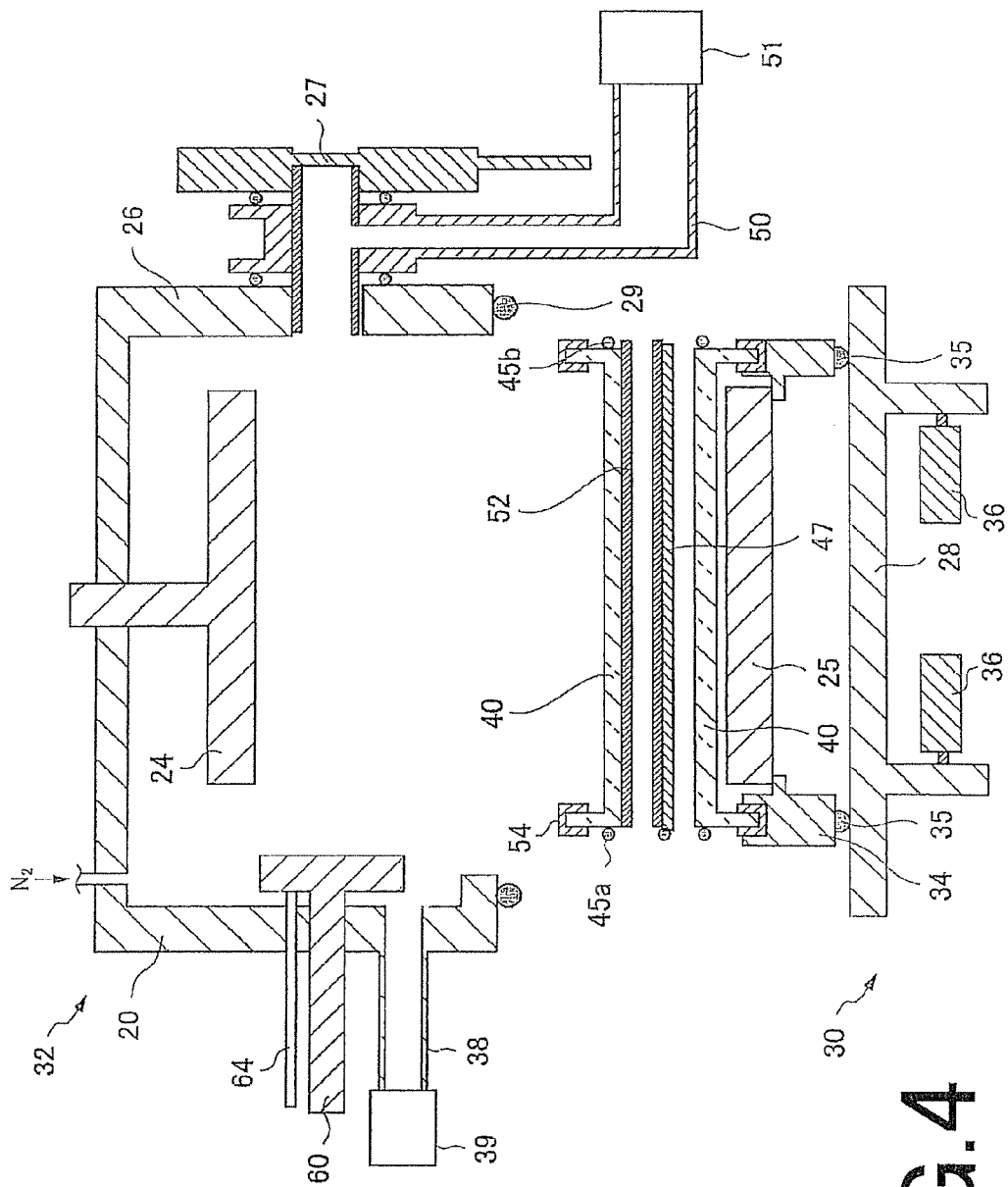
FIG. 4 is a sectional view illustrating a state in which an upper portion and a lower portion of a first container are separated in the atomic layer deposition apparatus of FIG. 1.

A schematic configuration of the atomic layer deposition apparatus during cleaning will be described below with reference to FIG. 4. FIG. 4 is a sectional view illustrating a state in which the upper portion 32 and the lower portion 30 of the first container 20 are separated in the ALD apparatus 10.

In cleaning the second container 40, first, the pressing member 60 moves horizontally (leftward in FIG. 4) to release the press of the second container 40. Then, the lower portion 30 including the bottom portion 28 of the first container 20 is moved downward relative to the upper portion 32 using the lifting mechanisms 36, thereby separating the lower portion 30 from the upper portion 32. Therefore, the second container 40 supported by the support mechanism 34 on the bottom portion 28 is also separated from the upper portion 32.

As illustrated in FIG. 4, the upper portion 32 and the lower portion 30 of the first container 20 are separated from each other to horizontally move the support mechanism 34, which allows the second container 40 to be moved from immediately below the upper portion 32 of the first container. The second container 40 moving along with the lower portion 30 of the first container 20 is detached from the lower portion 30 of the first container 20. Therefore, the second container 40 is detached from the first container 20.

As illustrated in FIG. 4, according to the embodiment, the second container 40 provided in the first container 20 is easily taken out, so that the second container 40 can easily be cleaned. Examples of the cleaning treatment include performing wet etching and taking out an anti-adhesion plate 52 to exchange or clean the anti-adhesion plate 52.

DESCRIPTION OF LETTERS OR NUMERALS 10 atomic layer deposition apparatus
12 substrate
20 first container
22 first inner space
24, 25 heater
26 sidewall portion
27 shutter
28 bottom portion
29 O-ring
30 lower portion
31 upper portion
34 support mechanism
35 moving mechanism
36 lifting mechanism
38 exhaust pipe
39 exhaust unit
40 second container
42 second inner space
44, 44a, 44b first opening
45a, 45b O-ring
46 second opening
47 substrate support portion
50 exhaust pipe
51 exhaust unit
52 anti-adhesion plate
54 protective cap
60 pressing member
62, 62a, 62b gas supply port
64, 64a, 64b gas introduction pipe
70 fork portion

The invention claimed is:

1. An atomic layer deposition apparatus for forming a thin film on a substrate, comprising:
a first container that defines a first inner space, the first container including an upper portion and a lower portion configured to move vertically so as to separate from the upper portion;
a second container provided inside the first container to define a second inner space, the second container including a first opening at a first end of the second container in a lengthwise direction thereof, the lengthwise direction being a horizontal direction; a second opening at a second end of the second container opposite to the first end in the lengthwise direction thereof, the second opening being configured such that gas in the second inner space flows to an outside of the second inner space therethrough, the second end being configured to be pressed to an inner surface of the first container, and a distance between the first end and the second end being shorter than the maximum distance between the inner surfaces of the first container in the lengthwise direction; and
a substrate support portion configured to dispose the substrate horizontally thereon between the first opening and the second opening;
a support mechanism configured to support the second container on the lower portion, the support mechanism including a moving mechanism configured to move the support mechanism in the lengthwise direction on the lower portion; and a pressing member including a gas supply port configured to supply a source gas forming the thin film on the substrate to the second inner space through the first opening, the pressing member being configured to press the first end of the second container in the first inner space to move the second container and the support mechanism in the lengthwise direction so that the second end of the second container is pressed against an inner surface of the first container and the second inner space is closed from the first inner space.

2. The atomic layer deposition apparatus according to claim 1, wherein
the second container includes a substrate support portion disposing the substrate thereon, the substrate support portion having a plurality of notches on the second opening side end thereof, the plurality of the notches configured to receive a shape corresponding to a fork shape of a substrate insertion leading end of a conveyance carriage that carries in and out the substrate.

3. The atomic layer deposition apparatus according to claim 2, wherein the gas supply port is located above the substrate support portion, and located in the proximity of the first opening in a height direction.

4. The atomic layer deposition apparatus according to claim 1, wherein
the second container is configured to detach from the first container after the lower portion separates from the upper portion.

* * * * *